United States Patent
Nakamura et al.

(10) Patent No.: US 8,268,079 B2
(45) Date of Patent: Sep. 18, 2012

(54) VACUUM FILM DEPOSITION APPARATUS

(75) Inventors: Yukinori Nakamura, Kanagawa (JP);
Makoto Kashiwaya, Kanagawa (JP);
Takashi Kataoka, Kanagawa (JP);
Hiroshi Sohda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1130 days.

(21) Appl. No.: 12/058,716

(22) Filed: Mar. 30, 2008

(65) Prior Publication Data

US 2008/0236498 A1    Oct. 2, 2008

(30) Foreign Application Priority Data

Mar. 30, 2007    (JP) .................... 2007-090816

(51) Int. Cl.
*C23C 16/00*    (2006.01)
(52) U.S. Cl. ........ 118/719; 118/721; 118/726; 118/728; 118/729
(58) Field of Classification Search ............. 118/719, 118/730, 733; 156/915
See application file for complete search history.

(56) References Cited

U.S. PATENT DOCUMENTS

| | | | |
|---|---|---|---|
| 4,895,107 A * | 1/1990 | Yano et al. ............. | 118/722 |
| 5,855,687 A * | 1/1999 | DuBois et al. ............. | 118/729 |
| 6,454,864 B2 * | 9/2002 | Wytman ............. | 118/728 |

FOREIGN PATENT DOCUMENTS

| | | |
|---|---|---|
| JP | 05-070931 | 3/1993 |
| JP | 11-131232 A | 5/1999 |
| JP | 2001-316797 A | 11/2001 |
| JP | 2004-018885 A | 1/2004 |

OTHER PUBLICATIONS

Notification of Reasons for Refusal, dated Mar. 15, 2011, issued in corresponding JP Application No. 2007-090816, 4 pages in English and Japanese.
Notification of Reasons for Refusal, dated Jul. 5, 2011, issued in corresponding JP Application No. JP 2007-090816, 4 pages in English (2 page Japanese Action previously submitted on Sep. 19, 2011).
JP Action, dated Jul. 5, 2011, issued in corresponding JP Application No. 2007-090816, 2 pages in Japanese.

* cited by examiner

*Primary Examiner* — Karla Moore
(74) *Attorney, Agent, or Firm* — Sughrue Mion, PLLC (57) ABSTRACT

There is provided a vacuum film deposition apparatus which forms a film on a substrate by a vacuum film deposition technique, include: substrate holding means for holding the substrate; a deposition preventing member for preventing film deposition at undesired positions within the apparatus; and contacting means for bringing the substrate or the substrate holding means and the deposition preventing member into contact with each other.

6 Claims, 4 Drawing Sheets

VACUUM FILM DEPOSITION APPARATUS

The entire contents of documents cited in this specification are incorporated herein by reference.

BACKGROUND OF THE INVENTION

The present invention relates to a vacuum film deposition apparatus such as a vacuum evaporation apparatus. The invention more specifically relates to a vacuum film deposition apparatus capable of advantageously preventing a film-forming material from being deposited at undesired positions on the inner wall or other portion of a vacuum chamber even in the case of forming a thick film.

A radiation image detector which records a radiation image by first allowing a radiation (e.g. X-rays, α-rays, β-rays, γ-rays, electron beams or uv rays) to pass through an object, then picking up the radiation as an electric signal has conventionally been used in such applications as medical diagnostic imaging and industrial nondestructive testing.

Examples of this radiation image detector include a solid-state radiation detector (so-called "flat panel detector" which is hereinafter abbreviated as "FPD") that picks up the radiation as an electrical image signal, and an X-ray image intensifier that picks up the radiation image as a visible image.

FPDs are operated by one of two methods, direct conversion method and indirect conversion method; in the direct method which involves the use of a film of photoconductive material such as amorphous selenium and a thin film transistor (TFT), electron hole pairs (e-h pairs) emitted from the photoconductive film upon incidence of a radiation are collected and the collected e-h pairs are read as an electric signal by the TFT, whereby the radiation is "directly" converted to the electric signal; in the indirect method, a phosphor layer (scintillator layer) which is formed of a phosphor that emits light (fluorescence) upon incidence of a radiation is provided such that it converts the radiation to visible light, which is read with a photoelectric transducer, whereby the radiation "as visible light" is converted to an electric signal.

In the FPDs adopting the direct method, films of photoconductive material such as amorphous selenium are formed by vacuum film deposition methods including vacuum evaporation.

In vacuum evaporation, vapors of a film-forming material come in contact with the inner wall of a vacuum chamber or a substrate holding means for holding a substrate, causing a film to adhere thereto. When having deposited to a large quantity, such film having adhered to other portions than the substrate forms particles (small flakes), which may adhere to a film formed by vapor deposition or the substrate, or be incorporated into the vapor-deposited film, thus causing quality degradation.

Therefore, vacuum evaporation apparatuses prevent films from being undesirably formed in the respective portions of the vacuum evaporation apparatuses as exemplified by the vacuum chamber inner wall and substrate holding means (substrate carrier) by providing a deposition preventing plate for preventing evaporating vapors from reaching undesired areas as described in JP 5-70931 A or by providing a deposition preventing plate surrounding the vacuum chamber inner wall or a deposition preventing plate for preventing a film from being deposited onto the substrate carrier.

The deposition preventing plate is detachably mounted in such vacuum evaporation apparatus (vacuum chamber). After the end of film deposition, the deposition preventing plate is detached from the apparatus for the maintenance work and washed, then the washed deposition preventing plate is mounted again in the apparatus, thus preventing deposition of a large quantity of film material thereonto and quality degradation due to the aforementioned particles.

SUMMARY OF THE INVENTION

As described above, the photoconductive films of the direct-type FPDs are formed by a method such as vacuum evaporation. The photoconductive films may have thicknesses ranging from as small as 200 μm to as large as 1,000 μm.

Figure 5:
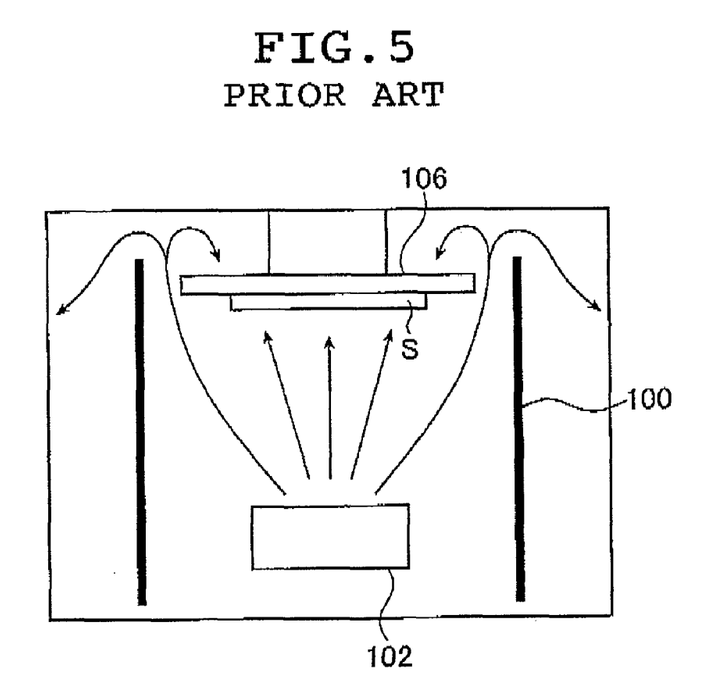
FIG. 5 is a schematic view illustrating how vapors of a film-forming material pass beyond a deposition preventing plate to reach the peripheral region thereof.

As schematically shown in FIG. 5, when such a thick film is to be formed by vacuum evaporation, vapors that were emitted from an evaporation source 102 but did not reach a substrate S pass beyond a deposition preventing plate 100 to reach the back surface of a substrate holder 106 and the inner wall of a vacuum chamber, where the vapors are adhered and deposited.

As described in JP 2001-316797 A, a film can be prevented from being formed on the inner wall of the vacuum chamber by bringing the deposition preventing plate into close contact with the inner wall surface of the vacuum chamber.

However, such a layout requires more time for the deposition preventing plate to be attached to or detached from the apparatus depending on the apparatus configuration, thus leading to reduced maintenance workability. This layout causes the substrate to be upsized, which also considerably increases the size of the deposition preventing plate, thus increasing the cost for the deposition preventing plate, that is, the cost for the vacuum evaporation apparatus. Further, the operation for cleaning the deposition preventing plate is also time-consuming, thus increasing the cost involved in the maintenance work of the apparatus.

What is more, this layout cannot prevent vapors of the film-forming material from reaching the back surface of the substrate holding means (substrate carrier) and being deposited thereon.

SUMMARY OF THE INVENTION

The present invention has been made to solve the aforementioned conventional problems and it is an object of the present invention to provide a vacuum film deposition apparatus which has a deposition preventing plate for use in preventing a film from being formed on undesired regions such as the vacuum chamber inner wall, which prevents, also when a film having a thickness as large as about 200 to 1,000 μm like a photoconductive layer of the direct-type FPD is to be formed, vapors of a film-forming material from passing beyond the deposition preventing plate to be deposited on the vacuum chamber inner wall and the back surface of the substrate holding means, which also prevents the deposition preventing plate from being upsized while ensuring a high degree of maintenance workability, and which is capable of minimizing increases in costs of the apparatus and maintenance work.

In order to achieve the above objects, the present invention provides a vacuum film deposition apparatus which forms a film on a substrate by a vacuum film deposition technique, include: substrate holding means for holding said substrate; a deposition preventing member for preventing film deposition at undesired positions within the apparatus; and contacting means for bringing said substrate or said substrate holding means and said deposition preventing member into contact with each other.

A vacuum film deposition apparatus according to the present invention, it is preferable that said contacting means moves one or both of said substrate and said substrate holding means toward said deposition preventing member to bring said substrate or said substrate holding means and said deposition preventing member into contact with each other. Further, it is preferable that an elastic member is provided at a portion where said substrate or said substrate holding means is in contact with said deposition preventing member. Further, it is preferable that said deposition preventing member has a first member which is brought into contact with said substrate or said substrate holding means, and a second member in which said first member is inserted or which is inserted in said first member. Further, it is preferable to has means for rotating said substrate. Further, it is preferable that said deposition preventing member doubles as a mask for regulating a film deposition area on said substrate. Further, it is preferable to includes a transport mechanism for transporting said substrate. Furthermore, it is preferable that said substrate holding means comprises a holding means body which moves so as to get closer to or farther from said deposition preventing member and a substrate holder which holds said substrate and is detachably mounted on said holding means body; and said transport mechanism transports said substrate through transport of said substrate holder and said substrate holding means has an attachment/detachment mechanism which automatically attaches or detaches said substrate holder to or from said holding means body.

According to the present invention having the features described above, the deposition preventing member such as the deposition preventing plate is brought into contact or substantial contact with the substrate holding means or the substrate to close with the substrate and the substrate holding means, the upper side of the space where vapors of the film-forming material flow such that the approximately airtight space which has the evaporation source, includes the substrate when seen from the above, and faces the surface of the substrate where a film is to be formed can be produced by the deposition preventing member and the substrate holding means.

Therefore, the present invention can prevent vapors of the film-forming material from passing beyond the deposition preventing member to reach the inner wall of the vacuum chamber and the back surface of the substrate holding means and a film from being deposited thereon, even in the case of forming a thick film with a thickness of about 200 μm to about 1,000 μm like the photoconductive layer of the direct-type FPD. The deposition preventing member can also be reduced in size to ensure a high degree of maintenance workability while also minimizing increases in costs of the apparatus and maintenance work.

DETAILED DESCRIPTION OF THE PREFERRED EMBODIMENTS

On the pages that follow, the vacuum film deposition apparatus of the present invention is described in detail with reference to the preferred embodiments depicted in the accompanying drawings.

Figure 1A:
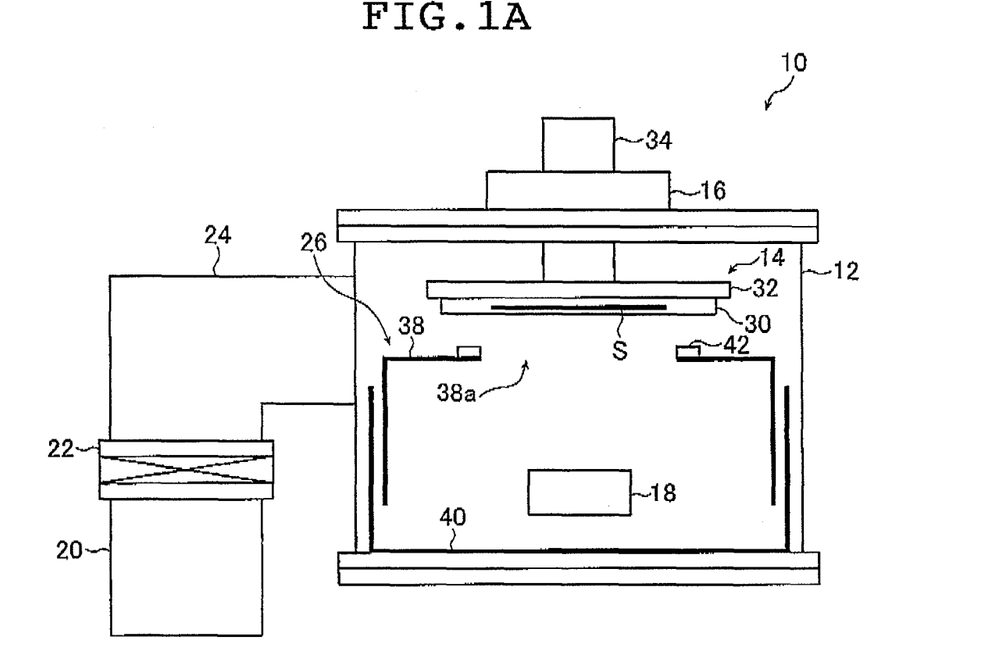
FIGS. 1A and 1B are views schematically showing an embodiment of a vacuum film deposition apparatus of the present invention applied to a vacuum evaporation apparatus.
Figure 1B:
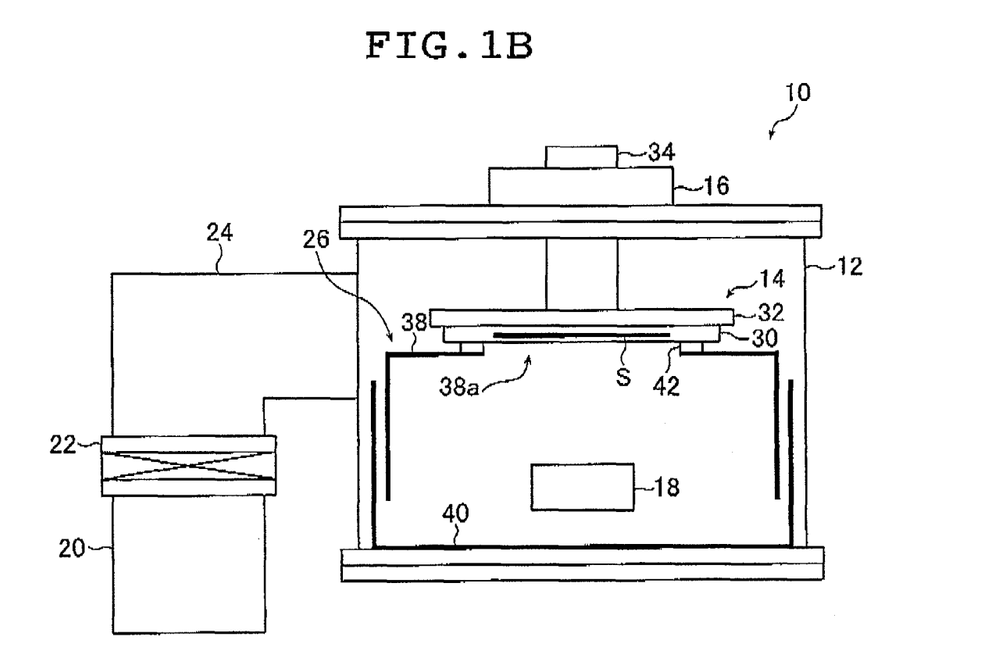

FIGS. 1A and 1B schematically show an embodiment of a vacuum film deposition apparatus of the present invention applied to a vacuum evaporation apparatus.

As shown in FIGS. 1A and 1B, a vacuum film deposition apparatus (hereinafter referred to simply as a "film deposition apparatus") 10 includes a vacuum chamber 12, substrate holding means 14, rotation/vertical movement means 16, an evaporation source 18, a vacuum pump 20, a valve 22, an evacuation path 24, and a deposition preventing plate 26.

In addition to the illustrated members, the film deposition apparatus 10 of the present invention may of course include any of various members that known vacuum evaporation apparatuses may have, as exemplified by gas introducing means for introducing various gases such as inert gases (e.g., argon) into the vacuum chamber 12, a shutter for blocking out vapors from the evaporation source 18.

Such film deposition apparatus 10 is used to form a film on the surface of a substrate S by vacuum evaporation. As in conventional vacuum evaporation apparatuses, the pressure in the vacuum chamber 12 is reduced to heat to melt and evaporate a film-forming material accommodated in the evaporation source 18 to deposit the film-forming material on the surface of the substrate S held by the substrate holding means 14.

There is no particular limitation on the substrate S used in the present invention, and use may be made of materials appropriate to products to be obtained, as exemplified by a glass plate, a plastic (resin) film or plate, and a metal plate.

Any film may be deposited (formed) on the substrate S without any particular limitation, and films capable of being deposited by vacuum evaporation are all available.

As will be described later in detail, the vacuum film deposition apparatus of the present invention performs film deposition with the deposition preventing plate 26 in contact with the substrate holding means 14 (or the substrate S), so that the phenomenon that vapors of the film-forming material (evaporation stream) exceed the deposition preventing plate 26 to reach the inner wall of the vacuum chamber 12 and the back surface of the substrate holding means 14 (which is opposite to the side on which the substrate is held, i.e., upper surface) and a film is deposited thereon, in other words, vapors of the film-forming material come in contact therewith to cause film adhesion and deposition can be advantageously prevented.

Therefore, the present invention is particularly suitable for use in forming a thick film, and more particularly suitable for use in forming a photoconductive layer of a direct-type radiation image detector (i.e., flat panel detector (abbreviated as FPD) that need have a thickness of about 200 to about 1,000 μm. The present invention is most particularly suitable for use in forming an amorphous selenium film serving as a photoconductive layer of the FPD, because selenium as a film-forming material vaporizes at a low temperature to readily reach the vacuum chamber inner wall and the back surface of the substrate holding means and be deposited thereon.

In the case of using the vacuum film deposition apparatus of the present invention in manufacturing the FPDs, the vacuum film deposition apparatus may be applied to those of an electric reading system which involve the use of a film of photoconductive material such as amorphous selenium and a thin film transistor (TFT) and allow a radiation image to be obtained by collecting electron hole pairs (e-h pairs) emitted from the photoconductive film upon incidence of a radiation and detecting them as a electric current from a portion where TFT switching was carried out, or alternatively those of an optical reading system which allow a radiation image to be obtained by having a photoconductive layer for recording and a photoconductive layer for reading formed of an amorphous selenium compound or the like, and a charge accumulation layer of $As_2Se_3$ formed between both the photoconductive layers, accumulating latent image charges by irradiation with a radiation, passing the latent image charges by irradiation with reading light and detecting them as an electric current.

The vacuum chamber 12 of the film deposition apparatus 10 may be any known vacuum chamber (e.g. bell jar or vacuum vessel) that is formed of iron, stainless steel, aluminum, etc. and which is employed in apparatuses for vacuum evaporation.

The vacuum pump 20 is used to evacuate the vacuum chamber 12 through the evacuation path 24 to reduce the internal pressure of the vacuum chamber 12. The valve 22 is a known valve for closing the evacuation path 24 in an airtight manner or for adjusting the amount of air discharged from the vacuum pump 20. In the present invention, an oil diffusion pump, a cryogenic pump, a turbomolecular pump or any other known pump may be used for the vacuum pump optionally in combination with a cryogenic coil.

The evaporation source 18 is also a known evaporation source that may be used in vacuum evaporation apparatuses to accommodate a film-forming material and heat to melt the accommodated film-forming material.

Therefore, there is no particular limitation on the evaporation source 18 used. It may depend on resistance heating, electron beam (ES) heating or induction heating, and a suitable method may be selected and used as appropriate for the film to be formed or conditions for film deposition.

The present invention is not limited to the case where the film deposition apparatus 10 has one evaporation source 18. The apparatus 10 may have a plurality of evaporation sources 18 or perform multi-source vacuum evaporation with the plurality of evaporation sources 18 accommodating mutually different film-forming materials.

The substrate holding means 14 includes a substrate holder 30, a substrate plate 32 and a rotary shaft 34.

The substrate holder 30 accommodates and holds the substrate S with the film-forming area on the substrate S facing the evaporation source 18. Any of various substrate holders used in vacuum film deposition apparatuses such as vacuum evaporation apparatuses, as exemplified by a frame for holding the four sides of the substrate S and a casing which opens in the portion corresponding to the film-forming area and accommodates the substrate S are all available. The substrate holder 30 may double as a mask for regulating the film-forming area on the film-forming surface of the substrate S. Alternatively, a mask may be separately provided.

In the illustrated case, the substrate holder 30 is detachably mounted on the substrate plate 32 at its predetermined position by a known means such as a method using a fitting or engaging member. The substrate plate 32 is a disk-shaped member whose back surface side is secured to the lower end of the cylindrical rotary shaft 34. Further, the rotary shaft 34 is axially supported by the rotation/vertical movement means 16.

More specifically, in the illustrated film deposition apparatus 10, the substrate S is loaded in the film deposition apparatus 10 at its predetermined position by putting the substrate S in the substrate holder 30 and mounting the substrate holder 30 on the substrate plate 32.

In the illustrated case, the rotary shaft 34 and the substrate plate 32 are secured to each other so that their centers are in agreement with each other. In addition, the substrate holder 30 is mounted on the substrate plate 32 so that the center of the substrate S agrees with the center of the substrate plate 32.

In the film deposition apparatus 10, a heating means for heating the substrate S in the substrate holder 30 or a thermally conductive sheet for uniformly transmitting heat from the heating means to the substrate S may be provided at the lower surface of the substrate plate 32.

The inner surface of the substrate holder 30 may also be provided with a thermally conductive sheet which is in close contact with the back side of the substrate S opposite to the side where a film is to be formed and uniformly transmits heat from the heating means of the substrate plate 32 to the substrate S.

As described above, the back side of the substrate plate 32 is secured to the rotary shaft 34, which in turn is axially supported by the rotation/vertical movement means 16.

The rotation/vertical movement means 16 rotates the rotary shaft 34 about its axis and moves it in axial directions. Any known method may be used to rotate and vertically move the rotary shaft 34 with the rotation/vertical movement means 16.

As described above, the substrate plate 32 is secured to the lower end of the rotary shaft 34 and the substrate holder 30 accommodating the substrate S is mounted on the substrate plate Therefore, the substrate holder 30, in other words, the substrate S is rotated by the rotation/vertical movement means 16, which also vertically move the substrate holder 30 so that the substrate holder 30 may get closer to or further away from the deposition preventing plate 26 (or its upper surface) to reach or depart from an elastic member 42 disposed on the upper surface of the deposition preventing plate 26.

The deposition preventing plate 26 is a deposition preventing member which prevents the film-forming material evaporated from the evaporation source 18 from contacting the inside of the apparatus at undesired positions and being deposited to form a film at the undesired positions. As used herein, the "undesired positions" in the apparatus basically encompass the positions other than the surface of the substrate S on which a film is to be formed, including the inner wall surface of the vacuum chamber 12 and the back surface of the substrate holding means 14 (substrate plate 32 in the illustrated case) and inner surface of the evacuation path 24.

The film deposition apparatus 10 may optionally have a deposition preventing member in addition to the deposition preventing plate 26.

The deposition preventing plate 26 in the illustrated case includes a first deposition preventing plate 38 located on the upper side (substrate holding means 14 side), a second deposition preventing plate 40 located on the lower side and the elastic member 42.

The first deposition preventing plate 38 is a cylindrical member having an opened lower surface and an upper surface with a circular opening 38a.

The first deposition preventing plate 38 is detachably mounted in the vacuum chamber 12 at its predetermined position so that the axis of the first deposition preventing plate 38 agrees with the axis of rotation of the rotary shaft 34. The first deposition preventing plate 38, when mounted in the vacuum chamber 12 at its predetermined position, is held so as to be rotatable about the axis of the plate 3S by any known means.

The circular opening 38 is formed at the upper surface of the first deposition preventing plate 38 so that its center agrees with the axis of rotation of the rotary shaft 34 and has a size that is larger than the size of the substrate S in the substrate holder 30 but is smaller than the size of the lower surface of the substrate holder 30.

The elastic member 42 is provided on the upper surface of the first deposition preventing plate 38 so as to surround the opening 38a at the opening edge.

The elastic member 42 may be made of any material that has a sufficient degree of elasticity to allow the elastic member 42 to adhere to the substrate 30 in a substantially airtight manner upon contact with the substrate holder 30 to be described later and that satisfies required properties such as heat resistance. Exemplary materials include silicone rubber and fluororubber.

On the other hand, the second deposition preventing plate 40 is a cylindrical member having an opened upper surface and a closed lower surface, and has a sufficient inner diameter to allow the first deposition preventing plate 38 to be inserted therein.

The second deposition preventing plate 40 is detachably mounted in the vacuum chamber 12 at its predetermined position with its axis in agreement with the axis of rotation of the rotary shaft 34 (i.e., axis of the first deposition preventing plate 38). At the time the second deposition preventing plate 40 is mounted at the predetermined position, the evaporation source 18 is accommodated therein, then the first deposition preventing plate 38 is inserted therein.

The operation of the film deposition apparatus 10 is described below.

In the illustrated film deposition apparatus 10, as shown in FIG. 1A, the rotary shaft 34, that is, the substrate plate 32 is first moved upward (in the direction in which the substrate plate 32 gets away from the first deposition preventing plate 38 of the deposition preventing plate 26) by the rotation/vertical movement means 16.

In this state, the substrate holder 30 accommodating the substrate S is mounted on the substrate plate 32 at its predetermined position and the evaporation source 18 is filled with the film-forming material. Then, the vacuum chamber 12 is closed. Thereafter, the vacuum pump 20 is driven to open the valve 22 to start evacuation of the vacuum chamber 12. Further, heating of the film-forming material in the evaporation source 18 is started.

The timing at which heating of the film-forming material is started is not limited to this, and the timing may be set as appropriate for the melting point of the film-forming material and heating capability of the evaporation source, for example simultaneously with or after the descent of the substrate holder 30 to be described later, or between the start of evacuation and the descent of the substrate holder 30 to be described later.

When the vacuum chamber 12 has reached a predetermined degree of vacuum, the rotation/vertical movement means 16 moves downward the rotary shaft 34, that is, the substrate plate 32 to bring the substrate holder 30 mounted on the substrate plate 32 into contact with the elastic member 42, as shown in FIG. 1B.

In this step, the first deposition preventing plate 38 and the substrate holding means 14 are engaged with each other so as to integrally move at least in the rotational direction by means of recesses and projections having been engaged with each other or engaging members. Alternatively, the substrate holder 30 may be pressed against the elastic member 42 so that the first deposition preventing plate 38 and the substrate holding means 14 are integrally moved at least in the rotational direction.

Then, the rotation/vertical movement means 16 rotates the rotary shaft 34 to cause the substrate holder 30, that is, the substrate S as well to rotate about its own axis to rotate the first deposition preventing plate 38 as well.

Then, the shutter is opened to start film deposition on the substrate S.

When a film of a predetermined thickness is deposited on the substrate S, the evaporation source 18 stops heating the film-forming material, and the rotation/vertical movement means 16 stops rotating the rotary shaft 34, that is, the substrate S and moves upward the rotary shaft 34.

Then, the vacuum chamber 12 is opened to the atmosphere, and the substrate holder 30 containing the substrate S on which a film has been deposited is detached from the substrate plate 32 and is fed to the next step.

As described above, the opening 38a at the upper surface of the first deposition preventing plate 38 has a size that is larger than that of the substrate S but is smaller than that of the lower surface of the substrate holder 30, and the opening 38a, the substrate S and the rotary shaft 34 are coaxially arranged. Further, the second deposition preventing plate 40 contains the evaporation source and the first deposition preventing plate 38 is inserted in the second deposition preventing plate 40.

In other words, the substrate holder 30 is moved downward to be brought into contact with the upper surface of the first deposition preventing plate 38, whereby an approximately airtight space which covers the substrate S and faces its film deposition surface is formed in the vicinity of the substrate S by means of the deposition preventing plate 26 and the substrate holder 30 (and optionally the substrate plate 32) as shown in FIG. 1B. In this state, a film can be formed on the substrate S through vacuum evaporation.

Therefore, according to the present invention, even in the case of forming a thick film with a thickness of 200 to 1,000 μm such as a photoconductive layer of an FPD, or the case of using a readily evaporating film-forming material such as selenium, vapors of the film-forming material can be advantageously prevented from passing beyond the deposition preventing plate 26 to cause film deposition on the inner wall of the vacuum chamber 12 and on the back surface of the substrate holding means (substrate plate 32 in the illustrate case).

In addition, an approximately airtight space facing the film deposition surface of the substrate S is formed in the vicinity of the substrate S by means of the deposition preventing plate 26 and the substrate holder 30 (and optionally the substrate plate 32), which can suppress upsizing of the deposition preventing member and also ensures a high degree of maintenance workability with minimized increases in costs of the apparatus and the maintenance work.

In the illustrated case, the deposition preventing plate 26 is of a double structure which includes the first deposition preventing plate 38 and the second deposition preventing plate 40 in which the first deposition preventing plate 38 is inserted. Further, the first deposition preventing plate 38 is made rotatable to bring the substrate holder 30 in contact with the elastic member 42 of the first deposition preventing plate 38 to thereby form the approximately airtight space. In spite of this situation, vapor deposition can be performed while rotating the substrate S.

In the illustrated film deposition apparatus 10, the smaller the space between the first deposition preventing plate 38 and the second deposition preventing plate 40 is, the higher the effect achieved is in preventing film deposition on the inner wall of the vacuum chamber 12. Therefore, the space between the first and second deposition preventing plates 38, 40 is preferably reduced, as long as the first deposition preventing plate 38 can be smoothly rotated and evacuation of the approximately airtight space formed by the deposition preventing plate 26 by means of the vacuum pump 20 is not hampered.

The more the first deposition preventing plate 38 is inserted in the second deposition preventing plate 40 (the larger the length of the overlapping first and second deposition preventing plates 38, 40 is, the higher the effect achieved is in preventing film deposition on the inner wall of the vacuum chamber 12. The first deposition preventing plate 38 is preferably inserted in the second deposition preventing plate 40 so that the overlapping length is as large as possible.

The illustrated embodiment has the structure in which the first deposition preventing plate 38 contacting the substrate holder 30 is inserted in the second deposition preventing plate 40. However, this is not the sole case of the present invention, and an opposite structure in which the second deposition preventing plate 40 is inserted in the first deposition preventing plate 38 contacting the substrate holder 30 may be adopted.

The film deposition apparatus 10 shown in FIGS. 1A and 1B has the function of rotating the substrate S. However, this is not the sole case of the present invention and film deposition may be performed with the substrate S fixed.

Figure 2A:
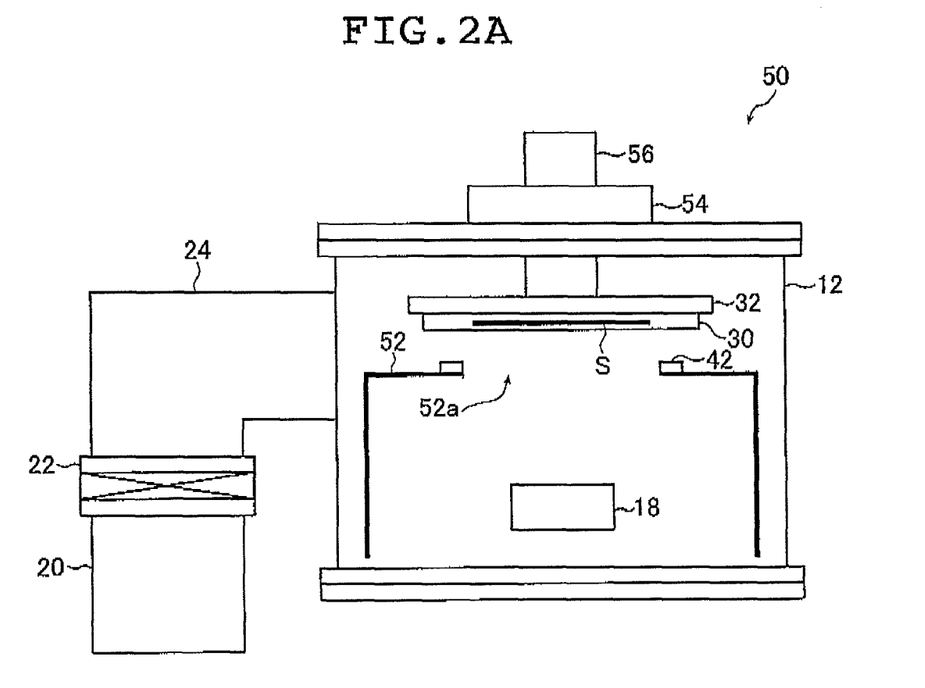
FIGS. 2A and 2D are views schematically showing another embodiment of the vacuum film deposition apparatus of the present invention applied to a vacuum evaporation apparatus.
Figure 2B:
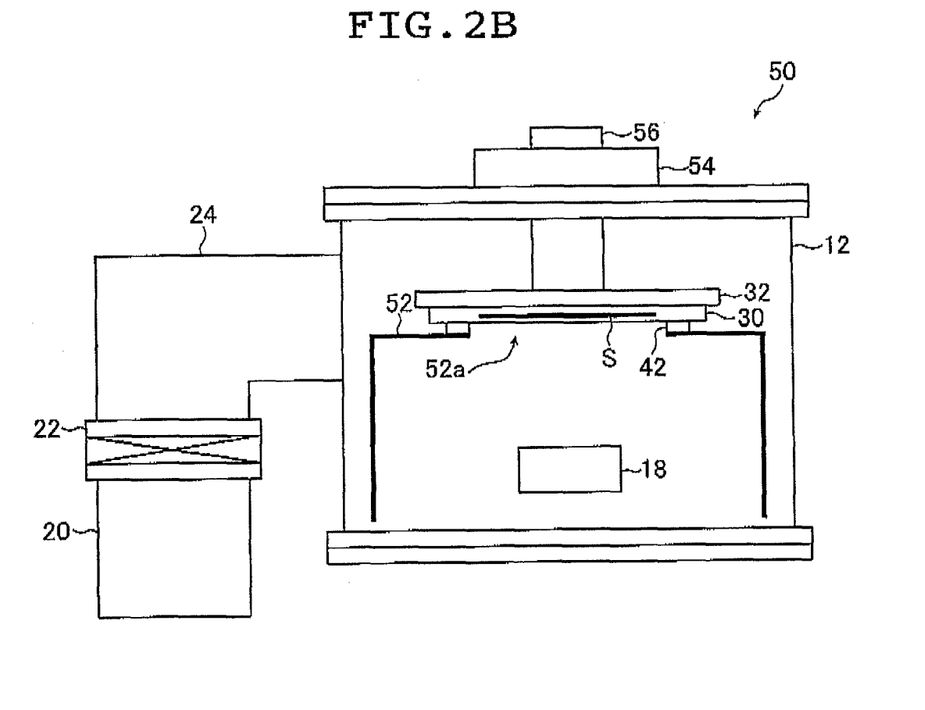

FIGS. 2A and 2B show an example thereof. Many components are shared between a film deposition apparatus 50 shown in FIGS. 2A and 2B and the film deposition apparatus 10 shown in FIGS. 1A and 1B, so like components are denoted by like numerals and the following description mainly focuses on distinctive portions.

Unlike the deposition preventing plate 26 composed of two members including the first deposition preventing plate 38 and the second film deposition preventing plate 40, the film deposition apparatus 50 shown in FIGS. 2A and 2B has a deposition preventing plate 52 composed of only one member. The film deposition apparatus 50 may optionally have a deposition preventing member in addition to the deposition preventing plate 52.

The deposition preventing plate 52 is a cylindrical or prismatic member whose lower side is closed. The upper surface of the deposition preventing plate 52 is provided with an opening 52a that has, as in the opening 38a, a size larger than that of a substrate S but smaller than that of a substrate holder 30. An elastic member 42 is disposed on the periphery of the opening 52a at the upper surface of the deposition preventing plate 52.

The deposition preventing member 52 is detachably mounted in a vacuum chamber 12 at its predetermined position and is fixed in the state in which it is mounted in the vacuum chamber 12.

In the film deposition apparatus 50 in which the substrate S is not rotated, the rotary shaft 34 is replaced by a shaft 56 which has a substrate plate 32 fixed to the lower end thereof and the rotation/vertical movement means 16 is replaced by vertical movement means 54 for only vertically moving the shaft 56.

The deposition preventing member 52 is mounted at such a position that the substrate S in the substrate holder 30 mounted on the substrate plate 32 is within the opening 52a in a vertical direction in which the shaft 56 is moved upward or downward.

Therefore, in the film deposition apparatus 50 as well, the shaft 56, that is, the substrate holder 30 is moved downward from the state shown in FIG. 2A to be brought into contact with the elastic member 42 as shown in FIG. 2B, whereby an approximately airtight space which covers the substrate S and faces its film deposition surface is formed in the vicinity of the substrate S by means of the deposition preventing plate 52 and the substrate holder 30 (and optionally the substrate plate 32). In this state, a film can be formed on the substrate S through vacuum evaporation as in the aforementioned film deposition apparatus 10. Accordingly, vapors of the film-forming material can be prevented from passing beyond the deposition preventing plate 52 to cause film deposition on the back surface of the substrate plate 32 and the inner wall of the vacuum chamber 12.

In the aforementioned film deposition apparatuses 10 and 50, the elastic member 42 is brought into contact with the substrate holder 30. However, this is not the sole case of the present invention, and the elastic member 42 may be brought closer to or into substantial contact with the substrate holder 30 to form the approximately airtight space. Alternatively, instead of using the elastic member 42, the first deposition preventing plate 38 may be brought into contact or substantial contact with the substrate holder 30 to form the approximately airtight space.

Figure 3:
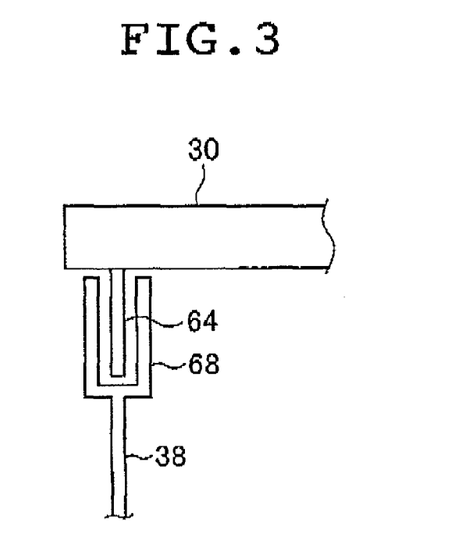
FIG. 3 schematically shows an example of a state in which a substrate holder substantially contacts a deposition preventing member in the vacuum film deposition apparatus of the prevent invention.

In the case of bringing the substrate holder 30 into substantial contact with the deposition preventing plate (deposition preventing member), a structure as schematically shown in FIG. 3 with reference to the deposition preventing plate 26 of the film deposition apparatus 10 is also available in which a wall portion 64 is formed at the lower surface of the substrate holder 30 so as to surround the substrate S; a recess 68 for receiving the wall portion 64 is formed at the upper end of the first deposition preventing plate 38; the wall portion 64 is inserted into the recess 68 to bring the first deposition preventing plate 38 into substantial contact with the substrate holder 30 thereby forming the approximately airtight space.

In any of the embodiments described above, the substrate holder 30 is brought into contact with or substantial contact with the deposition preventing plate 26 or the deposition preventing plate 52 (deposition preventing member). However, this is not the sole case of the present invention, and the substrate plate 32 having the substrate holder 30 mounted thereon may be brought into contact or substantial contact with the deposition preventing plate 26 or the deposition preventing plate 52 thereby forming the approximately airtight space.

Alternatively, instead of the substrate holder 30 or the substrate plate 32, the substrate S may be brought into contact or substantial contact with the deposition preventing plate 26 or the deposition preventing plate 52. In this case, the deposition preventing plate (deposition preventing member) may be made to serve as a mask for regulating the film deposition area on the substrate S. In the case of bringing the substrate S into contact or substantial contact with the deposition preventing plate, a structure may be applied in which only the substrate S is moved to get closer to or farther away from the deposition preventing plate.

The vacuum film deposition apparatus of the present invention may have a means for transporting the substrate S (substrate holder 30). Further, an in-line film deposition apparatus which includes the transport means—having vacuum deposition apparatuses connected to each other and forms film layers on the substrate S may be provided.

Figure 4:
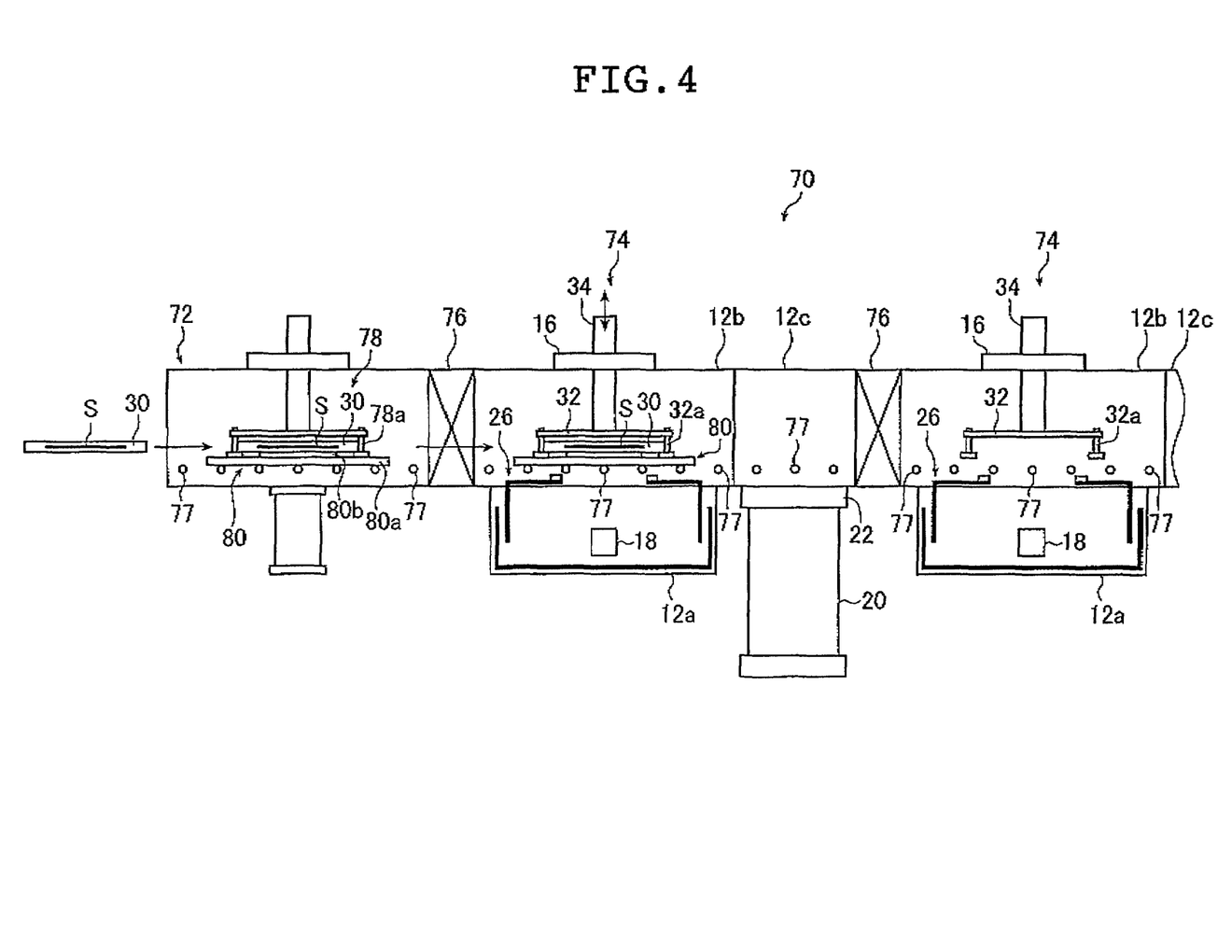
FIG. 4 schematically shows an exemplary in-line film deposition apparatus to which the vacuum film deposition apparatus shown in FIG. 1A is applied.

FIG. 4 schematically shows an example of such in-line film deposition apparatus. An in-line film deposition apparatus (hereinafter referred to as an "in-line apparatus") 70 is an application of the (vacuum) film deposition apparatus 10 shown in FIG. 1A, and includes a substrate preparation section (hereinafter referred to as a "preparation section") 72 and film deposition sections 74. The film deposition apparatus 10 is applied to the film deposition sections so that they have the same structure.

Shutters 76 are provided between the preparation section 72 and the film deposition section 74 adjacent thereto and between the adjacent film deposition sections 74. The shutter 76 is opened to make the preparation section 72 or any of the film deposition sections 74 communicate with the film deposition section adjacent thereto, and is shut to hermetically close its corresponding sections.

Each of the sections has transport rollers 77.

In the illustrated in-line apparatus 70 as well, a substrate S is accommodated in a substrate holder 30 to be used in film deposition. In the preparation section 72, setting means 78 sets the substrate holder 30 on a transport carrier 80.

For example, the lower end of a hook 78a of the setting means 78 is inserted under the bottom of the substrate holder 30 to hold the substrate holder 30 from the bottom to set it on the transport carrier 80.

The transport carrier 80 has a body 80a and a setting portion 80b which is smaller in size than the body 80a and the substrate holder 30. The setting means 78 sets the substrate holder 30 on the setting portion 80b.

The transport carrier 80 is moved by the transport rollers 77. In other words, the substrate holder 30 (substrate S) is set on the transport carrier 80 and moved by the transport rollers 77 to the respective film deposition sections 74.

In the illustrated case, a vacuum chamber 12 in each of the film deposition sections 74 includes three portions, that is, a film deposition portion 12a, a substrate holding portion 12b and a transport portion 12c. A vacuum pump 20 is connected to the transport portion 12c through a valve 22. In other words, in each of the illustrated film deposition sections 74, the transport portion 12c serves as the evacuation path 24 described above.

The film deposition portion 12a is provided with the aforementioned deposition preventing plate 26 (the upper end of the first deposition preventing plate 38 is located in the substrate holding portion 12b) and an evaporation source 18. The substrate holding portion 12b includes the aforementioned substrate holding means 14 (except the substrate holder 30) and rotation/vertical movement means 16, and the transport rollers 77.

In each of the film deposition sections 74, a substrate plate 32 of the substrate holding means 14 has hooks 32a which are similar to the hooks 78a. Like the setting means 78 of the preceding preparation section 72, the substrate plate 32 inserts the lower end of each of the hooks 32a under the bottom of the substrate holder 30 to hold it from the bottom.

Holding of the substrate holder 30 with the hooks 32a of the substrate plate 32 and the hooks 78a of the setting means 78, respectively, is not the sole case of the present invention but various known methods may be used.

The operation of the in-line apparatus 70 is described below.

When the substrate holder 30 is fed to a predetermined position of the preparation section 72 in the illustrated in-line apparatus 70, the setting means 78 holds the substrate holder 30 with the hooks 78a to set it on the transport carrier 80 disposed at a predetermined position.

When the substrate holder 30 is set on the transport carrier 80 in the preparation section 72, the necessary shutter 76 is opened to allow the transport carrier 80 to be transported to any of the film deposition sections 74 (e.g., the film deposition section 74 adjacent to the preparation section 72) by the transport rollers 77.

The transport carrier 80 having the substrate holder 30 set thereon is transported to and stopped at a predetermined position under the substrate holding means 14 of the substrate holding portion 12b.

When the transport carrier 80 is stopped, the rotation/vertical movement means 16 moves downward the rotary shaft 34, that is, the substrate plate 32. The substrate plate 32, when moved downward to a predetermined position, holds the substrate holder 30 with the hooks 32a. Once the substrate holding means 32 holds the substrate holder 30, the rotation/vertical movement means 16 moves upward the rotary shaft 34 to lift the substrate holder 30 from the transport carrier 80. Then, the transport rollers 77 transport the transport carrier 80 in the opposite direction to the preparation section 72 and the shutter 76 is closed.

Upon closure of the shutter 76, evacuation of the vacuum chamber and heating of the film-forming material are started as in the aforementioned film deposition apparatus 10. At the time a predetermined degree of vacuum has been reached, the rotation/vertical movement means 16 moves downward the rotary shaft 34, that is, the substrate holder 30 to perform film deposition on the substrate S by means of vacuum evaporation with the approximately airtight space being formed by the deposition preventing plate 26 and the substrate holder 30.

When a film with a predetermined thickness has been formed on the substrate S, the evaporation source 18 stops heating the film-forming material, while the rotation/vertical movement means 16 stops rotation of the rotary shaft 34, that is, the substrate S and moves upward the rotary shaft 34.

Then, when the film deposition section 74 is opened to the atmosphere (adjusted to a predetermined pressure), the necessary shutter 76 is opened to allow the substrate carrier 80 to be transported by the transport roller pairs 77 to a predetermined position under the substrate holding means 14 of the substrate holding portion 12b.

Thereafter, the rotation/vertical movement means 16 moves downward the rotary shaft 34, that is, the substrate holder 30 to a predetermined position, where the substrate plate 32 releases the substrate holder 30 held by the hooks 32a to set the substrate holder 30 on the setting portion 80b of the substrate carrier 80.

Once having been set on the substrate carrier 80, the substrate holder 30 is transported to the following film deposition section 74 by the transport rollers 77 and the next layer is formed in the same manner as above.

While the vacuum film deposition apparatus according to the present invention has been described above in detail, the present invention is by no means limited to the foregoing embodiments and it should be understood that various improvements and modifications may of course be made without departing from the scope and spirit of the invention.

For example, the above embodiments refer to the cases where the present invention is applied to vacuum evaporation apparatuses for depositing amorphous selenium, but the present invention is not limited to this and may also be applied to vacuum evaporation apparatuses for depositing various phosphor materials such as CsI:Na, CsI:Tl (scintillator phosphor) or CsBr:Eu (stimulable phosphor). Further, the present invention may also be applied to, various other vacuum film deposition apparatuses (vapor-phase deposition type film deposition apparatuses) such as sputtering apparatuses and CVD apparatuses.

What is claimed is:

1. A vacuum film deposition apparatus which forms a film on a substrate by a vacuum film deposition technique, comprising:

an evaporation source for forming a film on a substrate;

a deposition preventing member annularly surrounding said evaporation source for preventing film deposition at undesired positions within the apparatus;

a substrate holding means for holding said substrate comprising a holding means body which moves vertically so as to get closer to or farther from said deposition preventing member, and a substrate holder which holds said substrate and is detachably mounted on said holding means body using an attachment/detachment mechanism which automatically attaches or detaches said substrate holder to or from said holding means body;

a contacting means for causing said vertical movement of said holding means body closer to and further from said deposition preventing member, such that said substrate or said substrate holding means is brought into contact with said deposition preventing member; and a transport mechanism for transporting said substrate through transport of said substrate holder, the movement being substantially horizontal with respect to the vertical movement of said substrate holding means.

2. The vacuum film deposition apparatus according to claim 1, wherein said contacting means moves one or both of said substrate and said substrate holding means toward said deposition preventing member to bring said substrate or said substrate holding means and said deposition preventing member into contact with each other.

3. The vacuum film deposition apparatus according to claim 1, wherein an elastic member is provided at a portion where said substrate or said substrate holding means is in contact with said deposition preventing member.

4. The vacuum film deposition apparatus according to claim 1, wherein said deposition preventing member has a first member which is brought into contact with said substrate or said substrate holding means, and a second member in which said first member is inserted or which is inserted in said first member.

5. The vacuum film deposition apparatus according to claim 4, wherein said contacting means has means for rotating said substrate.

6. The vacuum film deposition apparatus according to claim 1, wherein said deposition preventing member doubles as a mask for regulating a film deposition area on said substrate.

\* \* \* \* \*